US012249664B2

(12) United States Patent
Becker et al.

(10) Patent No.: US 12,249,664 B2
(45) Date of Patent: Mar. 11, 2025

(54) TRANSPARENT CONDUCTING LAYERS AND PHOTOVOLTAIC DEVICES INCLUDING THE SAME

(71) Applicant: First Solar, Inc., Tempe, AZ (US)

(72) Inventors: James Becker, Perrysburg, OH (US); Mark Hendryx, Perrysburg, OH (US); William Huber, Ottawa Hills, OH (US); Jason Kephart, San Jose, CA (US); Andrei Los, Perrysburg, OH (US); Wei Zhang, San Jose, CA (US)

(73) Assignee: First Solar, Inc., Tempe, AZ (US)

( * ) Notice: Subject to any disclaimer, the term of this patent is extended or adjusted under 35 U.S.C. 154(b) by 0 days.

(21) Appl. No.: 18/027,584

(22) PCT Filed: Sep. 21, 2021

(86) PCT No.: PCT/US2021/051329
§ 371 (c)(1),
(2) Date: Mar. 21, 2023

(87) PCT Pub. No.: WO2022/061295
PCT Pub. Date: Mar. 24, 2022

(65) Prior Publication Data
US 2023/0402554 A1 Dec. 14, 2023

Related U.S. Application Data

(60) Provisional application No. 63/081,131, filed on Sep. 21, 2020.

(51) Int. Cl.
*H01L 31/0224* (2006.01)
*H01L 31/0272* (2006.01)
*H01L 31/0445* (2014.01)
*H01L 31/0725* (2012.01)

(52) U.S. Cl.
CPC ......... *H01L 31/022475* (2013.01); *H01L 31/02725* (2013.01); *H01L 31/0445* (2014.12); *H01L 31/0725* (2013.01)

(58) Field of Classification Search
CPC ..... H01L 31/022466; H01L 31/022475; H01L 31/02725; H01L 31/0445; H01L 31/0488; H01L 31/0725; H01L 31/078
See application file for complete search history.

(56) References Cited

U.S. PATENT DOCUMENTS

| | | | | |
|---|---|---|---|---|
| 5,922,142 | A | * | 7/1999 | Wu ............ C23C 14/0629 136/260 |
| 8,198,529 | B2 | | 6/2012 | Roberts et al. |
| 9,034,686 | B2 | | 5/2015 | Peng et al. |
| 9,276,142 | B2 | | 3/2016 | Peng et al. |

(Continued)

FOREIGN PATENT DOCUMENTS

EP    2381482 A1    10/2011

OTHER PUBLICATIONS

PCT Search Report and Written Opinion, Application No. PCT/US2021/051329, dated Dec. 23, 2021.

(Continued)

*Primary Examiner* — Golam Mowla
(74) *Attorney, Agent, or Firm* — MacMillan, Sobanski & Todd, LLC

(57) ABSTRACT

Photovoltaic devices having transparent contact layers are described herein.

20 Claims, 4 Drawing Sheets

(56) References Cited

U.S. PATENT DOCUMENTS

| | | |
|---|---|---|
| 10,056,507 B2 | 8/2018 | Shao et al. |
| 10,141,463 B2 | 11/2018 | Korevaar et al. |
| 11,417,785 B2 | 8/2022 | Liang et al. |
| 2003/0015728 A1* | 1/2003 | Bosco ................ H01L 31/0687 |
| | | 257/E27.012 |
| 2009/0020149 A1 | 1/2009 | Woods et al. |
| 2009/0308437 A1 | 12/2009 | Woods et al. |
| 2010/0015753 A1 | 1/2010 | Garnett |
| 2011/0041917 A1 | 2/2011 | Dauson et al. |
| 2011/0240115 A1 | 10/2011 | Buller et al. |
| 2011/0277812 A1 | 11/2011 | Buller et al. |
| 2012/0097222 A1 | 4/2012 | Gessert et al. |
| 2013/0206219 A1 | 8/2013 | Kurtin et al. |
| 2015/0047699 A1 | 2/2015 | Barnes et al. |
| 2015/0207011 A1 | 7/2015 | Garnett et al. |
| 2019/0296174 A1 | 9/2019 | Gloeckler et al. |
| 2022/0013674 A1 | 1/2022 | Bourgeois et al. |

OTHER PUBLICATIONS

Ferekides et al., "Transparent conductors and buffer layers for CdTe solar cells," Thin Solid Films, 2005, vol. 480-481, pp. 224-229.

* cited by examiner

TRANSPARENT CONDUCTING LAYERS AND PHOTOVOLTAIC DEVICES INCLUDING THE SAME

CROSS-REFERENCE TO RELATED APPLICATIONS

This is a national phase application of international application PCT/US2021/051329, filed on Sep. 21, 2021, and claims the benefit of U.S. Provisional Application No. 63/081,131, filed on Sep. 21, 2020, each of which is incorporated by reference in the entirety.

BACKGROUND

The present specification generally relates to transparent conducting layers for photovoltaic devices and, more specifically, to the use of particular combinations of materials and layer parameters to improve the efficiency of photovoltaic devices.

A photovoltaic device generates electrical power by converting light into electricity using semiconductor materials that exhibit the photovoltaic effect. Certain types of semiconductor material can be difficult to manufacture. For example, some material layers provided on the semiconductor material can have both desirable properties and undesirable properties. Unfortunately, the manufacturing process necessary to efficiently produce the semiconductor material can enhance the undesirable properties of the other material layers. Accordingly, material layers added to the photovoltaic device with the intent of improving efficiency, can ultimately decrease efficiency.

Accordingly, a need exists for alternative layer structures for use photovoltaic devices.

DETAILED DESCRIPTION

Photovoltaic devices can be formed from a stack of functional layers formed over a substrate. One or more of the functional layers can include a thin film of material, i.e., the photovoltaic device can be a thin film photovoltaic device. Thin film photovoltaic devices can include an absorber layer for converting light into charge carriers, and conductive layers for collecting the charge carriers. In some instances, a conducting layer can be formed towards an back side of the module with respect to the absorber layer. In single junction devices, the conductive layer can be disposed at the back side of the module and can use non-transparent metal layers as constituents. However, such non-transparent layers may be unsuitable for use as a conducting layer disposed between junctions in multi junction photovoltaic devices or tandem photovoltaic devices. The embodiments provided herein relate to transparent conductive layers and photovoltaic devices including the same. The disclosed transparent conductive layers can improve reliability and durability of current collecting portions of photovoltaic devices, while allowing the use of the photovoltaic devices in applications that require transparency, like windows, skylights, and tandem devices.

Figure 1:
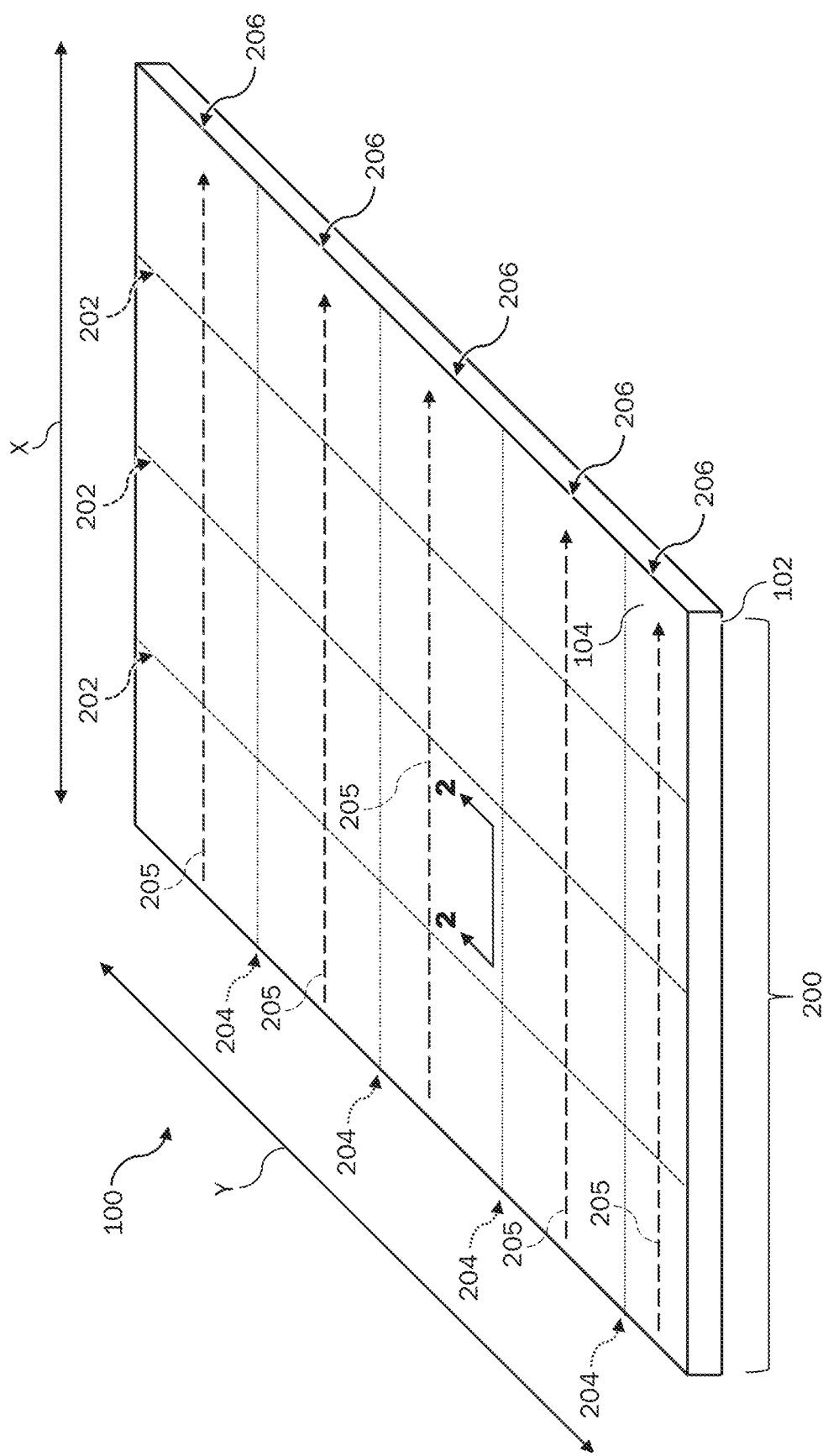
FIG. 1 schematically depicts a photovoltaic device according to one or more embodiments shown and described herein.

Referring now to FIG. 1, an embodiment of a photovoltaic device 100 is schematically depicted. The photovoltaic device 100 can be configured to receive light and transform light into electrical energy, e.g., photons can be absorbed from the light and transformed into electrical current via the photovoltaic effect. Thus, for sake of discussion and clarity, the photovoltaic device 100 can define a front side 102 configured to face a primary light source such as, for example, the sun. Additionally, the photovoltaic device 100 can also define a back side 104 offset from the front side 102 such as, for example, by a plurality of functional layers of material. It is noted that the term "light" can refer to various wavelengths of the electromagnetic spectrum such as, but not limited to, wavelengths in the ultraviolet (UV), infrared (IR), and visible portions of the electromagnetic spectrum. "Sunlight," as used herein, refers to light emitted by the sun.

The photovoltaic device 100 can include a plurality of layers disposed between the front side 102 and the back side 104. As used herein, the term "layer" refers to a thickness of material provided upon a surface. Each layer can cover all or any portion of an adjacent surface. In some embodiments, the layers of the photovoltaic device 100 can be divided into an array of photovoltaic cells 200. For example, the photovoltaic device 100 can be scribed according to a plurality of serial scribes 202 and a plurality of parallel scribes 204. The serial scribes 202 can extend along a length Y of the photovoltaic device 100 and demarcate the photovoltaic cells 200 along the length Y of the photovoltaic device 100. Neighboring cells of the photovoltaic cells 200 can be serially connected along a width X of the photovoltaic device 100. In other words, a monolithic interconnect of the neighboring cells 200 can be formed, i.e., adjacent to the serial scribe 202. The parallel scribes 204 can extend along the width X of the photovoltaic device 100 and demarcate the photovoltaic cells 200 along the width X of the photovoltaic device 100. Under operations, current 205 can predominantly flow along the width X through the photovoltaic cells 200 serially connected by the serial scribes 202. Under operations, parallel scribes 204 can limit the ability of current 205 to flow along the length Y. Parallel scribes 204 are optional and can be configured to separate the photovoltaic cells 200 that are connected serially into groups 206 arranged along length Y.

Referring still to FIG. 1, the parallel scribes 204 can electrically isolate the groups 206 of photovoltaic cells 200 that are connected serially. In some embodiments, the groups 206 of the photovoltaic cells 200 can be connected in parallel such as, for example, via electrical bussing. Optionally, the number of parallel scribes 204 can be configured to limit a maximum current generated by each group 206 of the photovoltaic cells 200. In some embodiments, the maximum current generated by each group 206 can be less than or equal to about 200 milliamps (mA) such as, for example, less than or equal to about 100 mA in one embodiment, less than or equal to about 75 mA in another embodiment, or less than or equal to about 50 mA in a further embodiment.

Figure 2:
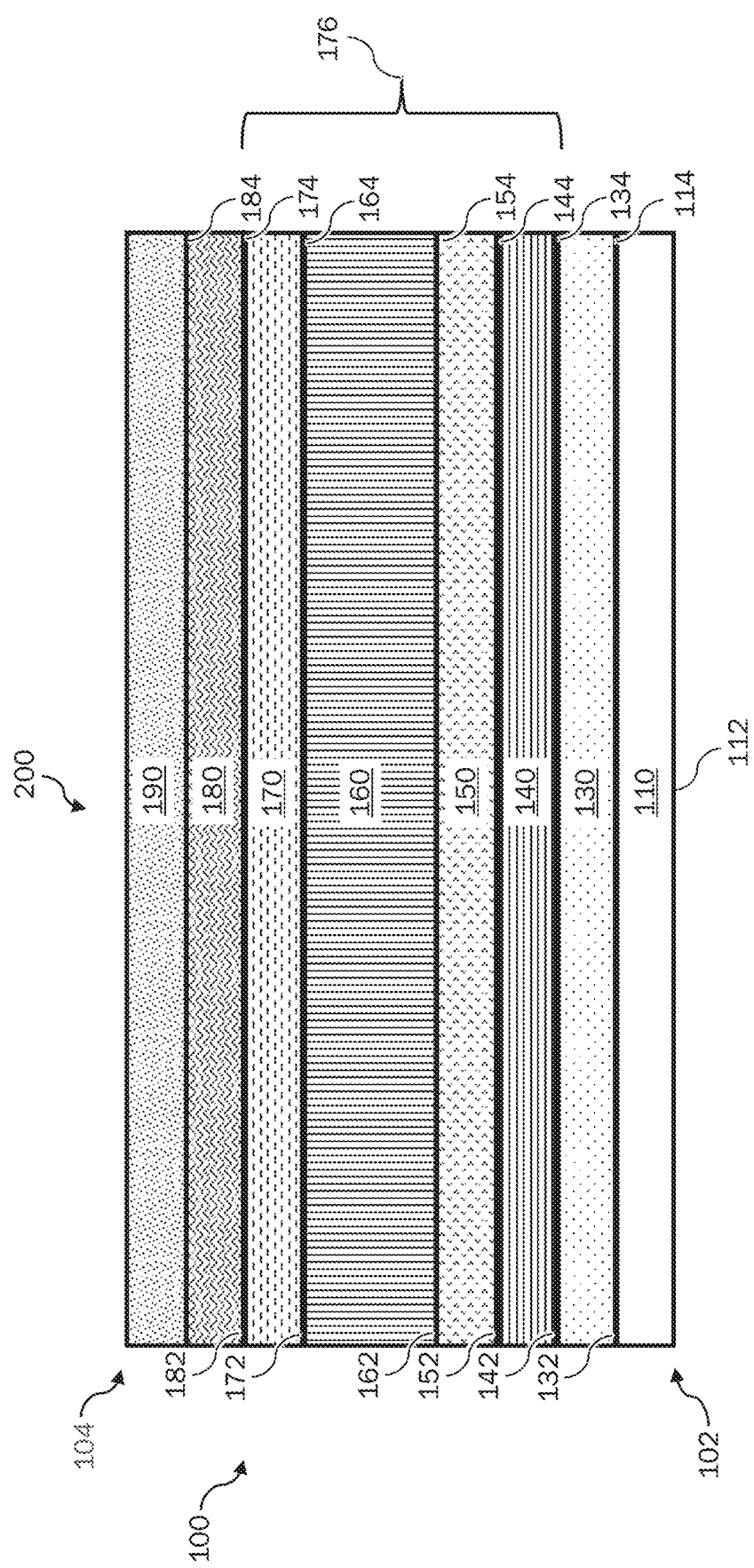
FIG. 2 schematically depicts a cross-sectional view along 2-2 of the photovoltaic device of FIG. 1 according to one or more embodiments shown and described herein;'
Figure 3:
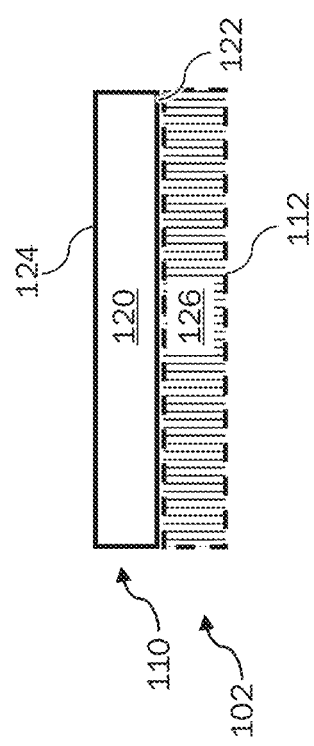
FIG. 3 schematically depicts a substrate according to one or more embodiments shown and described herein.

Referring now to FIG. 2, the layers of the photovoltaic device 100 can include a thin film stack provided over a substrate 110. The substrate 110 can be configured to facilitate the transmission of light into the photovoltaic device 100. The substrate 110 can be disposed at the front side 102 of the photovoltaic device 100. Referring collectively to FIGS. 2 and 3, the substrate 110 can have a first surface 112 substantially facing the front side 102 of the photovoltaic device 100 and a second surface 114 substantially facing the back side 104 of the photovoltaic device 100. One or more layers of material can be disposed between the first surface 112 and the second surface 114 of the substrate 110.

Referring to FIG. 3, the substrate 110 can include a transparent layer 120 having a first surface 122 substantially facing the front side 102 of the photovoltaic device 100 and a second surface 124 substantially facing the back side 104 of the photovoltaic device 100. In some embodiments, the second surface 124 of the transparent layer 120 can form the second surface 114 of the substrate 110. The transparent layer 120 can be formed from a substantially transparent material such as, for example, glass. Suitable glass can include soda-lime glass, or any glass with reduced iron content. The transparent layer 120 can have any suitable transmittance range, including about 250 nm to about 1,300 nm in some embodiments. The transparent layer 120 may also have any suitable transmittance percentage, including, for example, more than about 50% in one embodiment, more than about 60% in another embodiment, more than about 70% in yet another embodiment, more than about 80% in a further embodiment, or more than about 85% in still a further embodiment. In one embodiment, transparent layer 120 can be formed from a glass with about 90% transmittance, or more. Optionally, the substrate 110 can include a coating 126 applied to the first surface 122 of the transparent layer 120. The coating 126 can be configured to interact with light or to improve durability of the substrate 110 such as, but not limited to, an antireflective coating, an antisoiling coating, or a combination thereof.

Referring again to FIG. 2, the photovoltaic device 100 can include a barrier layer 130 configured to mitigate diffusion of contaminants (e.g., sodium) from the substrate 110, which could result in degradation or delamination of other layers of the photovoltaic stack. The barrier layer 130 can have a first surface 132 substantially facing the front side 102 of the photovoltaic device 100 and a second surface 134 substantially facing the back side 104 of the photovoltaic device 100. In some embodiments, the barrier layer 130 can be provided adjacent to the substrate 110. For example, the first surface 132 of the barrier layer 130 can be provided upon the second surface 114 of the substrate 100. The phrase "adjacent to," as used herein, means that two layers are disposed contiguously and without any intervening materials between at least a portion of the layers.

Generally, the barrier layer 130 can be substantially transparent, thermally stable, with a reduced number of pin holes and having high sodium-blocking capability, and good adhesive properties. Alternatively or additionally, the barrier layer 130 can be configured to apply color suppression to light. The barrier layer 130 can include one or more layers of suitable material, including, but not limited to, tin oxide, silicon dioxide, aluminum-doped silicon oxide, silicon oxide, silicon nitride, or aluminum oxide. The barrier layer 130 can have any suitable thickness bounded by the first surface 132 and the second surface 134, including, for example, more than about 100 Å in one embodiment, more than about 150 Å in another embodiment, or less than about 200 Å in a further embodiment.

Referring still to FIG. 2, the photovoltaic device 100 can include a transparent conductive oxide (TCO) layer 140 configured to provide electrical contact to transport charge carriers generated by the photovoltaic device 100. The TCO layer 140 can have a first surface 142 substantially facing the front side 102 of the photovoltaic device 100 and a second surface 144 substantially facing the back side 104 of the photovoltaic device 100. In some embodiments, the TCO layer 140 can be provided adjacent to the barrier layer 130. For example, the first surface 142 of the TCO layer 140 can be provided upon the second surface 134 of the barrier layer 130. Generally, the TCO layer 140 can be formed from one or more layers of n-type semiconductor material that is substantially transparent and has a wide band gap. Specifically, the wide band gap can have a larger energy value compared to the energy of the photons of the light, which can mitigate undesired absorption of light. The TCO layer 140 can include one or more layers of suitable material, including, but not limited to, tin dioxide, doped tin dioxide (e.g., F—$SnO_2$), indium tin oxide, or cadmium stannate ($Cd_2SnO_4$). In embodiments where the TCO layer 140 comprises cadmium stannate, the cadmium stannate can be provided in a crystalline form. For example, the cadmium stannate can be deposited as a film and then subjected to an annealing process, which transforms the thin film into a crystallized film.

The photovoltaic device 100 can include a buffer layer 150 configured to provide an insulating layer between the TCO layer 140 and any adjacent semiconductor layers. The buffer layer 150 can have a first surface 152 substantially facing the front side 102 of the photovoltaic device 100 and a second surface 154 substantially facing the back side 104 of the photovoltaic device 100. In some embodiments, the buffer layer 150 can be provided adjacent to the TCO layer 140. For example, the first surface 152 of the buffer layer 150 can be provided upon the second surface 144 of the TCO layer 140. The buffer layer 150 can include material having higher resistivity than the TCO later 140, including, but not limited to, intrinsic tin dioxide, zinc magnesium oxide (e.g., $Zn_{1-x}Mg_xO$), silicon dioxide ($SiO_2$), aluminum oxide ($Al_2O_3$), aluminum nitride (AlN), zinc tin oxide, zinc oxide, tin silicon oxide, or any combination thereof. In some embodiments, the material of the buffer layer 150 can be configured to substantially match the band gap of an adjacent semiconductor layer (e.g., an absorber). The buffer layer 150 may have any suitable thickness between the first surface 152 and the second surface 154, including, for example, more than about 100 Å in one embodiment, between about 100 Å and about 800 Å in another embodiment, or between about 150 Å and about 600 Å in a further embodiment.

Referring still to FIG. 2, the photovoltaic device 100 can include an absorber layer 160 configured to cooperate with another layer and form a p-n junction within the photovoltaic device 100. Accordingly, absorbed photons of the light can free electron-hole pairs and generate carrier flow, which can yield electrical energy. The absorber layer 160 can have a first surface 162 substantially facing the front side 102 of the photovoltaic device 100 and a second surface 164 substantially facing the back side 104 of the photovoltaic device 100. A thickness of the absorber layer 160 can be defined between the first surface 162 and the second surface 164. The thickness of the absorber layer 160 can be between about 0.5 μm to about 10 μm such as, for example, between about 1 μm to about 7 μm in one embodiment, or between about 1.5 μm to about 4 μm in another embodiment.

According to the embodiments described herein, the absorber layer 160 can be formed from a p-type semiconductor material having an excess of positive charge carriers, i.e., holes or acceptors. The absorber layer 160 can include any suitable p-type semiconductor material such as group II-VI semiconductors such as, for example, cadmium and tellurium. Further examples include, but are not limited to, semiconductor materials comprising cadmium, zinc, tellurium, selenium, or any combination thereof. In some embodiments, the absorber layer 160 can include ternaries of cadmium, selenium and tellurium (e.g., $CdSe_xTe_{1-x}$), or a compound comprising cadmium, selenium, tellurium, and one or more additional element (e.g., CdZnSeTe). The absorber layer 160 may further comprise one or more dopants. The photovoltaic devices 100 provided herein may include a plurality of absorber materials.

In embodiments where the absorber layer 160 comprises tellurium and cadmium, the average atomic percent of the tellurium in the absorber layer 160 can be greater than or equal to about 25 atomic percent and less than or equal to about 50 atomic percent such as, for example, greater than about 30 atomic percent and less than about 50 atomic percent in one embodiment, greater than about 40 atomic percent and less than about 50 atomic percent in a further embodiment, or greater than about 47 atomic percent and less than about 50 atomic percent in yet another embodiment. Alternatively or additionally, average atomic percent of the tellurium in the absorber layer 160 can be greater than about 45 atomic percent such as, for example, greater than about 49% in one embodiment. It is noted that the average atomic percent described herein is representative of the entirety of the absorber layer 160, the atomic percentage of material at a particular location within the absorber layer 160 can be graded through the thickness compared to the overall composition of the absorber layer 160. For example, the absorber layer 160 can have a graded composition.

In embodiments where the absorber layer 160 comprises selenium and tellurium, the average atomic percent of the selenium in the absorber layer 160 can be greater than 0 atomic percent and less or equal to than about 25 atomic percent such as, for example, greater than about 1 atomic percent and less than about 20 atomic percent in one embodiment, greater than about 1 atomic percent and less than about 15 atomic percent in another embodiment, or greater than about 1 atomic percent and less than about 8 atomic percent in a further embodiment. It is noted that the concentration of tellurium, selenium, or both can be graded through the thickness of the absorber layer 160. For example, when the absorber layer 160 comprises a compound including selenium at a mole fraction of x and tellurium at a mole fraction of 1−x ($Se_xTe_{1-x}$), x can vary in the absorber layer 160 with distance from the first surface 162 of the absorber layer 160.

Referring still to FIG. 2, the absorber layer 160 can be doped with a dopant configured to manipulate the charge carrier concentration. In some embodiments, the absorber layer 160 can be doped with a Group V dopant such as, for example, arsenic, phosphorous, antimony, or a combination thereof. Alternatively or additionally, the absorber layer 160 can be doped with a Group IB dopant such as, for example, copper, silver, gold, or a combination thereof. The total density of the dopant within the absorber layer 160 can be controlled. Moreover, the amount of the dopant can vary with distance from the first surface 162 of the absorber layer 160.

According to the embodiments provided herein, the p-n junction can be formed by providing the absorber layer 160 sufficiently close to a portion of the photovoltaic device 100 having an excess of negative charge carriers, i.e., electrons or donors. In some embodiments, the absorber layer 160 can be provided adjacent to n-type semiconductor material. Alternatively, one or more intervening layers can be provided between the absorber layer 160 and n-type semiconductor material. In some embodiments, the absorber layer 160 can be provided adjacent to the buffer layer 150. For example, the first surface 162 of the absorber layer 160 can be provided upon the second surface 154 of the buffer layer 150.

The photovoltaic device 100 can include a back contact layer 170 configured to mitigate undesired alteration of the dopant and to provide electrical contact to the absorber layer 160. The back contact layer 170 can have a first surface 172 substantially facing the front side 102 of the photovoltaic device 100 and a second surface 174 substantially facing the back side 104 of the photovoltaic device 100. A thickness of the back contact layer 170 can be defined between the first surface 172 and the second surface 174. The thickness of the back contact layer 170 can be between about 5 nm to about 200 nm such as, for example, between about 10 nm to about 50 nm in one embodiment.

In some embodiments, the back contact layer 170 can be provided adjacent to the absorber layer 160. For example, the first surface 172 of the back contact layer 170 can be provided upon the second surface 164 of the absorber layer 160. In some embodiments, the back contact layer 170 can include combinations of materials from Groups I, II, VI, such as for example, one or more layers containing zinc and tellurium in various compositions. Further exemplary materials include, but are not limited to, a bilayer of cadmium zinc telluride and zinc telluride, or zinc telluride doped with a group V dopant such as, for example, nitrogen. A thin film junction 176 can be defined as the thin film stack primarily contributing to the photovoltaic effect. For example, in some embodiments, the thin film junction 176 can include the transparent conductive oxide layer 140, the buffer layer 150, the absorber layer 160, the back contact layer 170, or combinations thereof.

Figure 4:
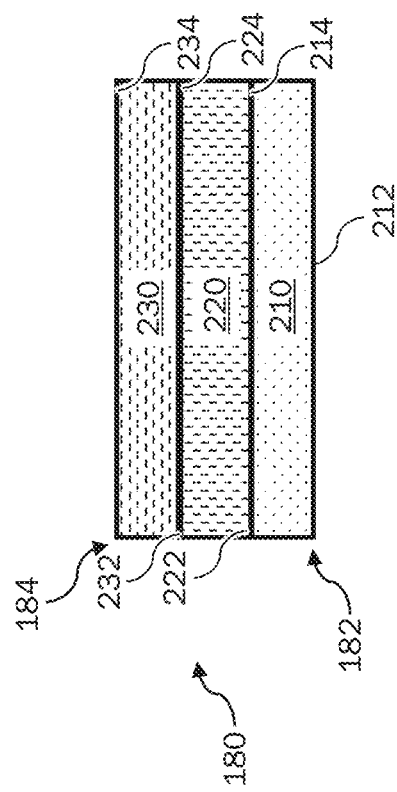
FIG. 4 schematically depicts the transparent conducting layer of the photovoltaic device of FIGS. 1 and 2 according to one or more embodiments shown and described herein.

Referring collectively to FIGS. 2, and 4, the photovoltaic device 100 can include a transparent conducting layer 180 configured to provide electrical contact with the back contact layer 170, the absorber layer 160, or both. The transparent conducting layer 180 can have a first surface 182 substantially facing the front side 102 of the photovoltaic device 100 and a second surface 184 substantially facing the back side 104 of the photovoltaic device 100. In some embodiments, the transparent conducting layer 180 can be provided adjacent to the back contact layer 170 or the absorber layer 160. For example, the first surface 182 of the transparent conducting layer 180 can be provided upon the second surface 174 of the back contact layer 170 or the second surface 162 of the absorber layer 160. A thickness of the transparent conducting layer 180 can be defined between the first surface 182 and the second surface 184. The thickness of the transparent conducting layer 180 can be less than about 500 nm such as, for example, between about 40 nm and about 400 nm in one embodiment, or between about 60 nm and about 350 nm.

According to the embodiments provided herein, the transparent conducting layer 180 can include one or more functional layers of material. In some embodiments, the conducting layer 180 can have an average transmittance greater than about 50% to light having a wavelength between 300 nm and 1300 nm. Optionally, the conducting layer 180 can have an average transmittance greater than about 50% to light having a wavelength 800 nm to 1300 nm such as, for example, greater than about 85% in one embodiment, or greater than about 90% in another embodiment, or greater than about 95% in further embodiment. The transparent conducting layer 180 can include a diffusion barrier layer 210 operable to limit diffusion of metal species into active areas of the cell 200 such as, for example, the absorber layer 160. Diffusion of metal species into the absorber layer 160 can degrade conversion efficiency of the cell 200. Such degradation and decreased performance can be particularly associated with hot and/or humid environments. Accordingly, the use of a suitable diffusion barrier 210 can improve performance of the photovoltaic device 100.

The diffusion barrier layer 210 can have a first surface 212 substantially facing the front side 102 of the photovoltaic device 100 and a second surface 214 substantially facing the back side 104 of the photovoltaic device 100. A thickness of the diffusion barrier layer 210 can be defined between the first surface 212 and the second surface 214. The thickness of the diffusion barrier layer 210 can be less than about 125 nm such as, for example, between about 2 nm and about 100 nm in one embodiment, or between about 5 nm and about 50 nm in another embodiment.

In some embodiments, the diffusion barrier layer 210 can be provided adjacent to the back contact layer 170. For example, the first surface 212 of the diffusion barrier layer 210 can be provided upon the second surface 174 of the back contact layer 170. Thus, in some embodiments, the first surface 182 of the back contact layer 180 can be formed by the first surface 212 of the diffusion barrier layer 210. Generally, the diffusion barrier layer 210 can be formed by a material with suitable transmittance capable of being doped "+" type. For example, charge densities of greater than about $1 \times 10^{16}$ cm$^{-3}$ can be considered to be "+" type. In some embodiments, the diffusion barrier layer 210 can be doped n+. In alternative embodiments, the the diffusion barrier layer 210 can be doped p+. Although the boundaries are not rigid, a material can be considered n-type if electron donor carriers are present in the range of about $1 \times 10^{11}$ cm$^{-3}$ to about $1 \times 10^{16}$ cm$^{-3}$, and n+ type if donor carrier density is greater than about $1 \times 10^{16}$ cm$^{-3}$. Similarly, a material is generally considered p-type if electron acceptor carriers (i.e. "holes") are present in the range of about $1 \times 10^{11}$ cm$^{-3}$ to about $1 \times 10^{16}$ cm$^{-3}$, and p+ type if acceptor carrier density is greater than about $1 \times 10^{16}$ cm$^{-3}$. The boundaries are not rigid and may overlap because a layer may be p+ relative to a layer that is p-type (or n+ relative to a layer that is n-type) if the carrier concentration is at least two orders of magnitude (i.e. 100-fold) higher, regardless of the absolute carrier density. Additionally, charge densities of greater than about $1 \times 10^{18}$ cm$^{-3}$ can be considered to be "++" type; and thus a layer of either n-type or p-type can be "++" relative to a layer of the same type that is itself "+" relative to yet a third layer, if the ++ layer has a same-type carrier density more than 100 fold that of the + layer.

Suitable materials for the diffusion barrier layer 210 can include refractory oxy-nitrides such as, for example, titanium oxy-nitrides (TiN$_x$O$_y$) or molybdenum oxy-nitrides (MoN$_x$O$_y$). Without being bound to theory, applicant has discovered that oxy-nitrides can exhibit improved optical properties, i.e., increased transmittance, with increased amounts of oxygen in the alloys. However, it is further believed that the electrical conductivity can degrade with the increased oxygen. Another group of materials suitable for use in the transparent diffusion barrier 310 include are transparent conductive oxides such as, for example, tin oxide (SnO$_2$) zinc oxide (ZnO), indium-tin oxide (In$_{(2-x)}$Sn$_x$O$_3$), cadmium oxide (CdO), and cadmium stannate (Cd$_2$SnO$_4$). These transparent conductive oxides can be doped with impurities such as F, Al, In, Ga, Ti, and others to alter their electrical and optical properties.

Unexpectedly, it was discovered that cadmium stannate (Cd$_2$SnO$_4$) demonstrated a superior combination of diffusion-blocking, optical properties, and electrical properties relative to other transparent conductive oxides. It was further discovered that amorphous cadmium stannate can be utilized for the diffusion barrier layer 210. As used herein, the term "amorphous" refers to a solid that lacks a long range order. Generally, amorphous cadmium stannate can be formed by depositing a layer of material without converting the morphology of the layer via a heat treatment process. For example, the amorphous cadmium stannate can be deposited at relatively low temperatures and without annealing after deposition. In some embodiment, amorphous cadmium stannate can be formed from Cd$_x$Sn$_{O4}$ material where $0.5 \leq x \leq 2$.

Referring still to FIGS. 2 and 4, the transparent conducting layer 180 can include a high conductivity layer 220 configured to provide low device series resistance. The high conductivity layer 220 can have a first surface 222 substantially facing the front side 102 of the photovoltaic device 100 and a second surface 224 substantially facing the back side 104 of the photovoltaic device 100. A thickness of the high conductivity layer 220 can be defined between the first surface 222 and the second surface 224. The thickness of the high conductivity layer 220 can be less than about 300 nm such as, for example, between about 30 nm and about 300 nm in one embodiment, between about 50 nm and about 250 nm in another embodiment, or between about 100 nm and about 250 nm in a further embodiment.

In some embodiments, the high conductivity layer 220 can be positioned further away from the absorber layer 160 or the back contact layer 170 relative to the diffusion barrier layer 210. Accordingly, the diffusion barrier layer 210 can be positioned between the absorber layer 160 and the high conductivity layer 220 or the back contact layer 170 and the high conductivity layer 220. Specifically, in some embodiments, the high conductivity layer 220 can be provided adjacent to the high-conductivity layer. For example, the first surface 222 of the high conductivity layer 220 can be provided upon the second surface 214 of the diffusion barrier layer 210. Generally, the high conductivity layer 220 can be formed by a material with suitable transmittance capable of being doped "++" type. In some embodiments, the diffusion barrier layer 210 can be doped n++. Accordingly, the high conductivity layer 220 can include a degneratively doped transparent conductive oxide. In some embodiments, the high conductivity layer 220 can be doped n++ intrinsically or with an oxide dopant. Suitable oxide dopants include, but are not limited to, In$_2$O$_3$, Ga$_2$O$_3$, TiO$_2$, Dy$_2$O$_3$, SnO$_2$, Y$_2$O$_3$, Al$_2$O$_3$, or any combination thereof. Applicants discovered that cadmium oxide (CdO) such as, for example, indium oxide doped cadmium oxide (CdO:In$_2$O$_3$) or gallium oxide doped cadmium oxide (CdO:Ga$_2$O$_3$) had relatively high electrical mobility compared to other transparent conductive oxides of suitable optical properties. Accordingly, embodiments of the high conductivity layer 220 including cadmium oxide demonstrated a relatively high fill factor, and improved photovoltaic performance.

According to the embodiments provided herein, the transparent conducting layer 180 can include a capping layer 230 operable to mitigate corrosion of the high conductivity layer 220 in hot and humid environments. The capping layer 230 can have a first surface 232 substantially facing the front side 102 of the photovoltaic device 100 and a second surface 234 substantially facing the back side 104 of the photovoltaic device 100. A thickness of the capping layer 230 can be defined between the first surface 232 and the second surface 234. The thickness of the capping layer 230 can be less than about 125 nm such as, for example, between about 2 nm and about 100 nm in one embodiment, or between about 5 nm and about 50 nm in another embodiment.

In some embodiments, the capping layer 230 can be positioned further away from the absorber layer 160 or the back contact layer 170 relative to the high conductivity layer 220. Accordingly, the high conductivity layer 220 can be positioned between the diffusion barrier layer 210 and the capping layer 230. Specifically, in some embodiments, the capping layer 230 can be provided adjacent to the high conductivity layer 220. For example, the first surface 232 of the capping layer 230 can be provided upon the second surface 224 of the high conductivity layer 220. The capping layer 230 can include a transparent conductive oxide, such as, for example, cadmium stannate. In some embodiments, the capping layer can include amorphous cadmium stannate.

Referring again to FIG. 2, the photovoltaic device 100 can include a back support 190 configured to cooperate with the substrate 110 to form a housing for the photovoltaic device 100. The back support 190 can be disposed at the back side 104 of the photovoltaic device 100. The back support 190 can include any suitable material, including, for example, borosilicate glass, float glass, soda lime glass, carbon fiber, or polycarbonate. Alternatively, the back support 190 may be any suitable material such as a polymer-based back sheet. The back support 190 and substrate 110 can protect the various layers of the photovoltaic device 100 from exposure to moisture and other environmental hazards.

Figure 5:
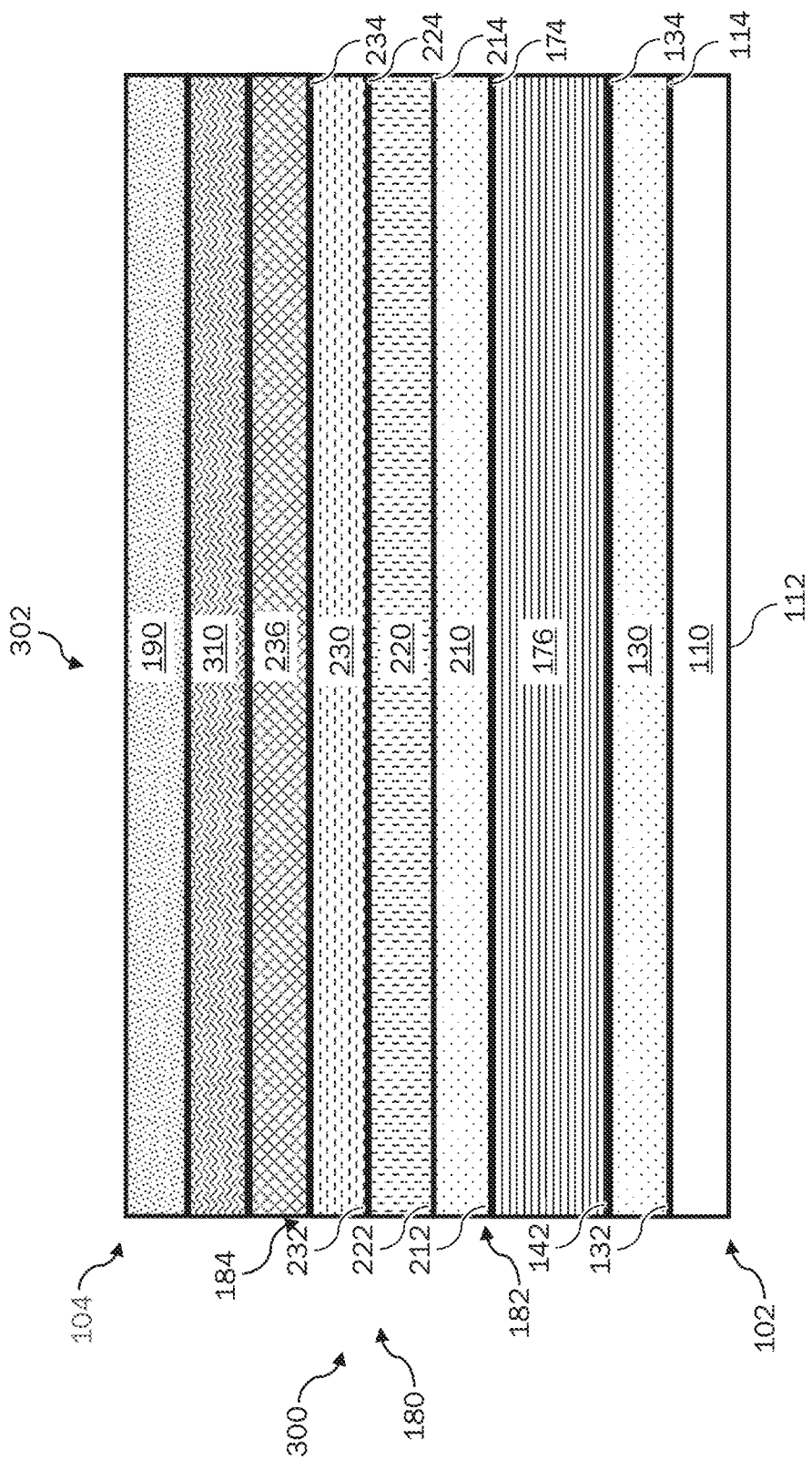
FIG. 5 schematically depicts a cross-sectional view of a tandem photovoltaic device according to one or more embodiments shown and described herein.

Referring to FIG. 5, a tandem photovoltaic device 300 is schematically depicted. The tandem photovoltaic device 300 can include a tandem cell 302, which can be formed via scribing as disclosed above with respect to the photovoltaic cells 200 of the photovoltaic device 100. The tandem cell 300 can include the thin film junction 176. The thin film junction 176 can be electrically connected via the transparent conducting layer 180 and, optionally, an electrical bus 236, to a second junction 310. As used herein, the phrase "electrically connected" can mean that constituents cooperate to form a substantially ohmic contact directly with one another or indirectly via one or more additional components. Accordingly, current can flow between the second junction 310 and the thin film junction 176 via the electrical connection. In some embodiments, the second junction 310 and the thin film junction 176 can be electrically connected in series. Alternatively, the second junction 310 and the thin film junction 176 can be electrically connected in parallel such as, for example, via one or more additional components or conductors. In some embodiments, the thin film junction 176 can be positioned nearer to the front side 102 of the tandem photovoltaic device 300 than the second junction 310. The transparent conducting layer 180 can be positioned between the thin film junction 176 and the second junction 310.

The second junction 310 can be configured to convert light into electrical energy via the photovoltaic effect. The second junction 310 can include a different semiconductor than the absorber layer 160 of the thin film junction 176 such as, for example, amorphous silicon (a-Si), crystalline silicon (c-Si), or copper indium gallium selenide (CIGS). The thin film junction 176 and the second junction 310 can be configured to absorb different ranges of wavelengths. For example, the thin film junction 176 can be configured to absorb shorter wavelengths of light than the second junction 310. In some embodiments, the average quantum efficiency between 800 nm and 1,300 nm of the thin film junction 176 can be less than about 20% such as, for example, less than about 10% in one embodiment, or less than about 5% in another embodiment. Additionally, the average quantum efficiency between 800 nm and 1,300 nm of the second junction 310 can be greater than about 50% such as, for example, greater than about 60% in one embodiment, or greater than about 65% in another embodiment.

It should now be understood that the functional layers of the transparent conducting layer can provide improved transmittance of light, while providing comparable electrical functionality and reliability relative to known non-transparent electrical contacts. Accordingly, the embodiments provided herein can improve the utility of photovoltaic devices. For example, a stack of the diffusion barrier, the high conductivity layer, and the capping layer described herein can be used as a tunnel junction in a tandem photovoltaic device. Alternatively, a stack of the diffusion barrier, the high conductivity layer, and the capping layer described herein can be used as a transparent back electrical contact for a transparent module or for a bifacial module.

According to embodiments described herein, a tandem photovoltaic device can include a thin film junction, a second junction, and a transparent conducting layer. The thin film junction can include an absorber layer including cadmium and tellurium. The second junction can be electrically connected with the thin film junction. Current can flow between the second junction and the thin film junction. The transparent conducting layer can be disposed between the thin film junction and the second junction. The current can flow through the transparent conducting layer. The transparent conducting layer can include a high conductivity layer and an adjacent layer. The high conductivity layer can include cadmium oxide doped "++" type intrinsically or with an oxide dopant. The adjacent layer that is in contact with the high conductivity layer.

In another embodiment, a tandem photovoltaic device can include a thin film junction, a second junction, and a transparent conducting layer. The thin film junction can include an absorber layer including cadmium and tellurium. The second junction can be electrically connected with the thin film junction. Current can flow between the second junction and the thin film junction. The transparent conducting layer can be disposed between the thin film junction and the second junction. The current can flow through the transparent conducting layer. The transparent conducting layer can include a high conductivity layer and an adjacent layer. The high conductivity layer can be doped n++. The adjacent layer is in contact with the high conductivity layer. The adjacent layer comprises amorphous cadmium stannate.

In yet another embodiment, a tandem photovoltaic device can include a thin film junction, a second junction, and a transparent conducting layer. The thin film junction can include an absorber layer including cadmium and tellurium. The second junction can be electrically connected with the thin film junction. Current can flow between the second junction and the thin film junction. The transparent conducting layer can be disposed between the thin film junction and the second junction. The current can flow through the transparent conducting layer. The transparent conducting layer can include amorphous cadmium stannate.

In a further embodiment, a photovoltaic device can include a thin film junction and a transparent conducting layer. The thin film junction can include an absorber layer including cadmium and tellurium. The transparent conducting layer can form at least a part of a series connection with the thin film junction. The transparent conducting layer can include a high conductivity layer and an adjacent layer. The high conductivity layer can be doped "++" type. The adjacent layer can be in contact with the high conductivity layer.

In another embodiment, photovoltaic device can include a thin film junction and a transparent conducting layer. The thin film junction can include an absorber layer including cadmium and tellurium. The transparent conducting layer can form at least a part of a series connection with the thin film junction. The transparent conducting layer can include a high conductivity layer and an adjacent layer. The high conductivity layer can include indium oxide doped cadmium oxide. The adjacent layer can be in contact with the high conductivity layer. The adjacent layer can include cadmium stannate.

In yet another embodiment, a photovoltaic device can include a thin film junction and a transparent conducting layer. The transparent conducting layer can conduct charge carriers from the thin film junction. The transparent conducting layer can include a high conductivity layer and an adjacent layer. The adjacent layer can be in contact with the high conductivity layer. The high conductivity layer comprises indium oxide doped cadmium oxide.

It is noted that the terms "substantially" and "about" may be utilized herein to represent the inherent degree of uncertainty that may be attributed to any quantitative comparison, value, measurement, or other representation. These terms are also utilized herein to represent the degree by which a quantitative representation may vary from a stated reference without resulting in a change in the basic function of the subject matter at issue.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A tandem photovoltaic device comprising:
    a thin film junction comprising an absorber layer comprising cadmium and tellurium;
    a second junction electrically connected with the thin film junction, wherein the second junction is closer to a back side of the tandem photovoltaic device than the thin film junction; and
    a transparent conducting layer disposed between the thin film junction and the second junction, wherein:
        the transparent conducting layer comprises a high conductivity layer, a diffusion barrier layer, and a capping layer,
        the diffusion barrier layer comprises cadmium stannate,
        the capping layer comprises cadmium stannate,
        the high conductivity layer comprises cadmium oxide doped "++" type intrinsically or with an oxide dopant, and
        the high conductivity layer is between the diffusion barrier layer and the capping layer.

2. The tandem photovoltaic device of claim 1, wherein at least one of the diffusion barrier layer or the capping layer comprises amorphous cadmium stannate, wherein the amorphous cadmium stannate is a $Cd_xSnO_4$ material, where the value of x is in a range from 0.5 to 2.

3. The tandem photovoltaic device of claim 2, wherein the cadmium oxide is doped n++ with the oxide dopant and has a charge density greater than $1 \times 10^{18}$ $cm^{-3}$.

4. The tandem photovoltaic device of claim 3, wherein the oxide dopant is $In_2O_3$.

5. The tandem photovoltaic device of claim 3, wherein the oxide dopant is $Ga_2O_3$.

6. The tandem photovoltaic device of claim 1, wherein:
    the capping layer is in contact with the high conductivity layer.

7. The tandem photovoltaic device of claim 1, wherein:
    the diffusion barrier layer is in contact with the high conductivity layer, and
    the diffusion barrier layer is in contact with a back contact layer of the thin film junction.

8. The tandem photovoltaic device of claim 1, wherein the high conductivity layer is thicker than the diffusion barrier layer, and a thickness of the high conductivity layer is less than 300 nm.

9. The tandem photovoltaic device of claim 1, wherein the transparent conducting layer has an average transmittance of greater than 85% to light having a wavelength between 800 nm and 1,300 nm, and a thickness of the transparent conducting layer is greater than 40 nm and less than 400 nm.

10. The tandem photovoltaic device of claim 1, wherein the thin film junction has an average quantum efficiency between 800 nm and 1,300 nm that is less than 20%.

11. The tandem photovoltaic device of claim 10, wherein the absorber layer of the thin film junction further comprises at least one of: zinc or selenium.

12. The tandem photovoltaic device of claim 1, wherein:
    the thin film junction comprises a back contact layer;
    the back contact layer is between the absorber layer and the transparent conducting layer; and
    the back contact layer comprises zinc and tellurium.

13. The tandem photovoltaic device of claim 1, wherein:
    the second junction has an average quantum efficiency between 800 nm and 1,300 nm that is greater than 50%; and
    the second junction comprises at least one of: amorphous silicon, crystalline silicon, or copper indium gallium selenide.

14. The tandem photovoltaic device of claim 1, wherein:
    the thin film junction comprises a transparent conductive oxide layer; and
    the absorber layer of the thin film junction is between the transparent conductive oxide layer and the transparent conducting layer.

15. The tandem photovoltaic device of claim 14, wherein the transparent conductive oxide layer comprises indium tin oxide.

16. The tandem photovoltaic device of claim 14, wherein the transparent conductive oxide layer comprises cadmium stannate, and wherein the cadmium stannate is crystalline.

17. A tandem photovoltaic device comprising:
    a thin film junction comprising an absorber layer comprising cadmium and tellurium;
    a second junction electrically connected with the thin film junction; and
    a transparent conducting layer disposed between the thin film junction and the second junction, wherein:
        the transparent conducting layer comprises a high conductivity layer, a diffusion barrier layer, and a capping layer,
        the diffusion barrier layer comprises cadmium stannate,
        the capping layer comprises cadmium stannate, the high conductivity layer comprises cadmium oxide, and the high conductivity layer is between the diffusion layer and the capping layer.

18. The tandem photovoltaic device of claim 17, wherein:

the second junction and the thin film junction are electrically connected in series; and the transparent conducting layer forms at least a part of a series connection with the thin film junction.

19. The tandem photovoltaic device of claim 17, wherein:

the thin film junction has an average quantum efficiency between 800 nm and 1,300 nm that is less than 20%;

the second junction has an average quantum efficiency between 800 nm and 1,300 nm that is greater than 50%;

the transparent conducting layer has an average transmittance of greater than 85% to light having a wavelength between 800 nm and 1,300 nm; and a thickness of the transparent conducting layer is greater than 40 nm and less than 400 nm.

20. The tandem photovoltaic device of claim 17, wherein:

the high conductivity layer consists essentially of cadmium oxide doped with an oxide dopant, wherein the oxide dopant is selected from one or more of: $In_2O_3$, $Ga_2O_3$, $TiO_2$, $Dy_2O_3$, $SnO_2$, $Y_2O_3$, or $Al_2O_3$; and the high conductivity layer has an n-type charge carrier density greater than about $1 \times 10^{18}$ $cm^{-3}$.

* * * * *